United States Patent
Pan et al.

(10) Patent No.: US 11,002,813 B2
(45) Date of Patent: May 11, 2021

(54) COOLING A GRADIENT COIL OF A MAGNETIC RESONANCE IMAGING SYSTEM

(71) Applicant: KONINKLIJKE PHILIPS N.V., Eindhoven (NL)

(72) Inventors: Jun Pan, Shanghai (CN); Lingcheng Yuan, Suzhou (CN); Jian Lin, Suzhou (CN); Yun Zhou, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/487,489

(22) PCT Filed: Feb. 21, 2018

(86) PCT No.: PCT/EP2018/054227
§ 371 (c)(1),
(2) Date: Aug. 21, 2019

(87) PCT Pub. No.: WO2018/153889
PCT Pub. Date: Aug. 30, 2018

(65) Prior Publication Data
US 2020/0057127 A1 Feb. 20, 2020

(30) Foreign Application Priority Data

Feb. 27, 2017 (WO) ................ PCT/CN2017/074996
Apr. 20, 2017 (EP) ..................................... 17167289

(51) Int. Cl.
*G01R 33/385* (2006.01)
*G01R 33/422* (2006.01)

(52) U.S. Cl.
CPC ....... *G01R 33/3856* (2013.01); *G01R 33/422* (2013.01)

(58) Field of Classification Search
CPC .............. G01R 33/3856; G01R 33/422; G01R 33/3858
See application file for complete search history.

(56) References Cited

U.S. PATENT DOCUMENTS 6,741,152 B1    5/2004   Arz
7,576,542 B1    8/2009   Lvovsky
(Continued)

FOREIGN PATENT DOCUMENTS

GB    2470137 A       11/2010
JP    01113034 A  *   5/1989

OTHER PUBLICATIONS

Peter T. While, Larry K. Forbes, et al.. Designing gradient coils with reduced hot spot temperatures. Journal of Magnetic Resonance. 203 (2010) 91-99.
(Continued)

*Primary Examiner* — Susan S Lee

(57) ABSTRACT

A gradient coil assembly of a magnetic resonance imaging system includes at least one gradient coil, a cooling arrangement for cooling the gradient coil, and an RF shield. The cooling arrangement includes at least one cooling tube that is configured to transport a cooling fluid and which is disposed on and in thermal contact with the gradient coil, wherein the assembly further comprises a thermal connector arrangement with at least one of a first thermal connector disposed between the RF shield and the at least one cooling tube, which provides a radially extending connection between the RF shield and the at least one cooling tube.

17 Claims, 6 Drawing Sheets

(56) References Cited

U.S. PATENT DOCUMENTS

| | | |
|---|---|---|
| 2005/0093543 A1 | 5/2005 | Arik et al. |
| 2005/0168222 A1 | 8/2005 | Arz et al. |
| 2008/0024134 A1 | 1/2008 | Schuster et al. |
| 2008/0197954 A1 | 8/2008 | Groeppel et al. |
| 2009/0120615 A1 | 5/2009 | Icoz et al. |
| 2011/0074419 A1 | 3/2011 | Sakakura |
| 2012/0119741 A1 | 5/2012 | Kimmlingen et al. |
| 2013/0075068 A1 | 3/2013 | Huber et al. |
| 2015/0346297 A1* | 12/2015 | Naka .................. G01R 33/307 324/322 |
| 2016/0047870 A1 | 2/2016 | Ham et al. |

OTHER PUBLICATIONS

International Search report from PCT/EP2018/054227 dated Jun. 13, 2018.

* cited by examiner

COOLING A GRADIENT COIL OF A MAGNETIC RESONANCE IMAGING SYSTEM

CROSS REFERENCE TO RELATED APPLICATIONS

This application is a U.S. national phase application of International Application No. PCT/EP2018/054227 filed on Feb. 21, 2018, which claims the benefit of International Application No. PCT/CN2017/074996 filed on Feb. 27, 2017 and EP Application Serial No. 17167289.2 filed on Apr. 20, 2017, both of which are incorporated herein by reference.

FIELD OF THE INVENTION

The invention relates to an assembly of a magnetic resonance imaging (MRI) system, the assembly comprising at least one gradient coil, a cooling arrangement for cooling the gradient coil and an RF shield, to an magnetic resonance imaging system with such an assembly, and to a method for cooling a gradient coil of a magnetic resonance imaging system.

BACKGROUND OF THE INVENTION

Gradient coils are usually built of loops of wire or thin conductive sheets which are provided on a cylindrical shell lying just inside the bore of an MRI system. When an electrical current is passed through these coils a secondary magnetic field is created. This secondary magnetic field constitutes a gradient field which superimposes the main magnetic field, thereby causing the resonance frequency of protons to vary as a function of position. In this way, spatial encoding of the magnetic resonance signals becomes possible. Further, gradient coils are also used for different physiologic techniques, such as magnetic resonance angiography, diffusion, and perfusion imaging.

In the past, gradient coils for MRI system often were comprised of individual wires wrapped on cylinders made of fiberglass and coated with epoxy resin. While for some applications such gradient coils are still in use, present MRI system usually comprises distributed windings in a finger-print pattern consisting of multiple thin metallic strips or large copper sheets etched into complex patterns and applied to the cylinder.

The walls along the inner bore of an MRI system usually become warm when an examination object is examined. This heating is mainly caused by eddy currents and resistive heating as current is passed through the gradient coil. Such gradient coils are typically driven by powerful pulse-width modulated amplifiers with peak coil driving voltages up to 2000 V and currents exceeding 600 A. Thus, intense heat is created with maximum internal coil temperatures reaching 55 to 60° C. The power required for operating a gradient coil scales with the fifth power of its radius which means that gradient coil design and cooling of gradient coils is even more difficult for modern wide-bore systems.

In this situation, for all gradient coils in MRI systems usually fluidic cooling is used in order to reduce the heating effects. Typically, water or a water-ethylene glycol solution from a heat exchange pump is used as a cooling fluid which is circulated through cooling tubes of a cooling arrangement of the MRI system, the cooling tubes being in thermally conducting contact with the gradient coil.

In addition to the heating of the gradient coils themselves, heat also originates from eddy current heating of the radiofrequency shield (RF shield) of the MRI system. The RF shield typically is the closest metallic structure to the examination object and is usually comprised of a grid located superficial to the RF coil and immediately beneath the inner resin wall of the bore of the MRI system.

When a fluctuant large current is supplied to the closely spaced gradient coil windings, inhomogeneous temperature fields and hot spots are introduced by Ohmic heating and low thermal conductivity of the resin material. Conventional methods to dissipate the heat and reduce the hot spots in the gradient coil at component bench level can be achieved by modifying the design of the gradient coil windings and/or by using alumina-ceramic materials with better thermal conductivity properties for the cylinders on which the gradient coils are provided.

Further, the thermal conductivity of the resin material of the gradient coil assembly can be improved as described in US 2013/0075068 A1. According to this document, a cooling device for disposal between two flat coils of a gradient coil has at least one first and at least one second foil that are connected to each other in areas such that continuous cooling channels for a cooling fluid are formed. The cooling channels are branched, whereby a cooling effect is produced with a small thickness of the cooling device.

Moreover, in US 2008/0024134 A1 an improved cooling circuit is described in order to address this issue. This document describes a method for manufacturing a cooling device for a gradient coil, the cooling device having at least one flexible cooling tube arranged on a carrier plate configured in accordance with a predetermined pattern, the at least one cooling tube originally having a circular cross section, is laid in accordance with the predetermined pattern and is flattened to permanently deform its cross section. US2011/0074419A1 discloses an MRI apparatus includes a static magnetic-field magnet that generates a static magnetic field in an imaging area in which a subject is to be placed. A RF coiled side cooling system including a plurality of cooling pipes that circulates a coolant in pipe is provided on the inner side of the main coil. However, in these ways, disturbing hot spots and the effect of an inhomogenous temperature field cannot be reduced in a sufficiently efficient manner yet. US2005093543 discloses to incorporate a on-magnetic, thermally conducting spreader substrate between the gradient coils and the serpentine cooling tube to reduce localized hot spots in electrical components to provide lower temperatures and more even temperature distributions in coils. However, incorporation of the spreader substrate will increase the thickness of the gradient coil assembly and thus reduce the bore size of MRI system, let alone complicating the manufacturing of the gradient coil assembly and increasing the cost accordingly.

SUMMARY OF THE INVENTION

It is an object of the invention to provide a gradient coil assembly of a magnetic resonance imaging (MRI) apparatus with improved thermal management.

This object is addressed by an assembly of a magnetic resonance imaging system, the assembly comprising at least one gradient coil, a cooling arrangement for cooling the gradient coil, and an RF shield, wherein the cooling arrangement comprises at least one cooling tube which is configured to transport a cooling fluid and which is disposed on and in thermal contact with the gradient coil, wherein the assembly further comprises a thermal connector arrangment with at least one of a first thermal connector and a second thermal connector, the first thermal disposed between the RF shield and the at least one cooling tube and in thermal contact with the RF shield and the at least one cooling tube thereby providing a radially extending thermal connection between the RF shield and the at least one cooling tube, and the second thermal connector affixed to and in thermal contact with the at least one cooling tube thereby providing a circumferentially extending thermal connecting between different windings windings of the at least one cooling tube and/or different tubes of the at least one cooling tube.

Therefore, the invention proposes to improve the thermal management by providing at least a first thermal connector and/or a second thermal connector. According to one aspect of the invention, it is aimed to cooling the RF shield by building a thermal bridge by the first thermal connector between the cooling arrangement and the RF shield. The invention allows for building a heat bridge in radial direction around the hottest layer considering insulation. According to another aspect of the invention, depending on the coil pattern of the gradient coil, the temperature of a wire populated area of the gradient coil will be higher than in other places of the gradient coil. Thus, building a heat bridge by the second thermal connector in a circumferential direction around the hotspots should help achieving a better homogeneity of the temperature distribution. By affixing the heat bridge to the cooling tube directly, which are preferably bonded or welded or glued across the cooling tubes, the heat bridge is substantially positioned in the plane for arranging the cooling tubes, and therefore the thickness of the gradient coil assembly is not increased. Due to the compact thermal arrangement, the homogeneity of the temperature field is improved and the hot spots are reduced without increasing the bore size of the MRI system.

Additionally, the cooling design according to the invention can be used at least in two different ways. When a gradient coil according to certain specifications has already been manufactured and hotspots are found during usage, thermal connectors can be arranged according to identified hotspots of the gradient coil in order to improve its performance. Alternatively or additionally, possible hotspots can also be identified by simulation during the design stage of the gradient coil, and thermal connectors can be placed on hotspots identified by simulation in order to improve the cooling. As acknowledged by the skilled in the art, the cooling arrangement accordingly to the present invention can be applied with no or few modification to conventional manufacturing process of gradient coil assemblies.

In general, according to the invention, the first thermal connector can be designed and arranged in different ways. According to an embodiment of the invention, the thermal connector arrangement comprises at least two first thermal connectors which are radially disposed outside the gradient coil at its two longitudinal ends thereby thermally connecting the RF shield with the cooling tube. Accordingly, in this design the two first thermal connectors do not go through the gradient coil. In this regard, the gradient coil and the RF shield are preferably embedded in a resin material, preferably an epoxy material, wherein for the two first thermal connectors free space of the resin material at boths ends, and outside the gradient coil, is used. In this way, further cooling can be achieved in an efficient way.

According to the invention, also the second thermal connector can be designed and arranged in different ways. However, according to a preferred embodiment of the invention, the second thermal connector between cooling tubes and/or different windings of a certain cooling tube comprises at least one cut-out in a longitudinal direction of the second thermal connector thereby forming a cooling fin extending away from the spot of the cooling tube in contact with the second thermal connector. Therefore, according to this design, instead of conducting heat from one part of the assembly to another part of the assembly, the thermal connectors helps to emit heat to the surroundings of the assembly and, thus, acts as a cooling fin by increasing the size of a cooling area.

Further, according to a preferred embodiment of the invention, the second thermal connector comprises a plurality of longitudinal thermal parts disposed on the at least one cooling tube (4) and a plurality of horizontal thermal parts thermally connecting the longitudinal thermal parts to each other. This may be a further measure in order to increase heat dissipation in order to improve the cooling of the assembly. In this regard, it is especially preferred that the second thermal connectors between cooling tubes and/or windings of the cooling tubes have a planar extension in the plane for disposing the at least one cooling tube (4).

Moreover, according to a preferred embodiment of the invention, the second thermal connector (5) comprises a plurality of thermal parts disposed on the at least one tube (4) in a staggered arrangement. Further, for fixing the the first thermal connector and the second thermal connector different possibilities apply. Preferably, the first thermal connector and/or the second thermal connector are bonded and/or welded and/or glued onto the cooling tube. This measure allows efficient cooling while being easy to manufacture. In this respect, it is especially preferred that the first thermal connector and/or the second thermal connector is welded on a metal ring wrapping around the at least one cooling tube (4).

According to a preferred embodiment of the invention, the first thermal connectors and/or the second thermal connectors are made from metal. More preferably, the first thermal connectors and/or the second thermal connectors are made from a flexible thermal conductor material. Preferably, the first thermal connectors and/or the second thermal connectors comprise a copper strap. A copper strap does not constitute a closed loop and usually will not generate induction heat.

Alternatively, according to a preferred embodiment of the invention, the first thermal connectors and/or the second thermal connectors are made from a thermally conductive ceramic material. This design has the advantage that due to the lack of metal components no influence on the gradient uniformity should be expected.

In general, the connections of the first thermal connector and/or the second thermal connector with the cooling tube can be designed in different ways. However, according to a preferred embodiment of the invention, the part of the first thermal connector and/or the second thermal connector which is fixed to the cooling tube covers the cooling tube circumferentially. In this way, a large contact area is achieved which further helps to dissipate the heat.

In addition the invention also relates to a magnetic resonance imaging system with an assembly as described above.

Further, the invention also relates to a method for cooling a gradient coil of a magnetic resonance imaging system, comprising the following steps: providing an assembly with a cooling arrangement for cooling the gradient coil, and an RF shield, and providing the cooling arrangement with at least one cooling tube which transports a cooling fluid and which is in thermal contact with the gradient coil, wherein a thermal connector arrangment is provided which comprises at least one of a first thermal connector and a second thermal connector, the first thermal connector disposed between the RF shield and the at least one cooling tube and in thermal contact with the RF shield and the at least one cooling tube thereby thermally connecting the RF shield with the at least one cooling tube, and the second thermal connector (5) disposed on and in thermal contact with the at least one cooling tube thereby thermally connecting windings of a first one of the at least one cooling tube and/or thermally connecting a second one of the at least one cooling tube to a third one of the at least one cooling tube.

Preferred embodiments of this method relate to the preferred embodiments of the assembly of a magnetic resonance imaging system as described above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
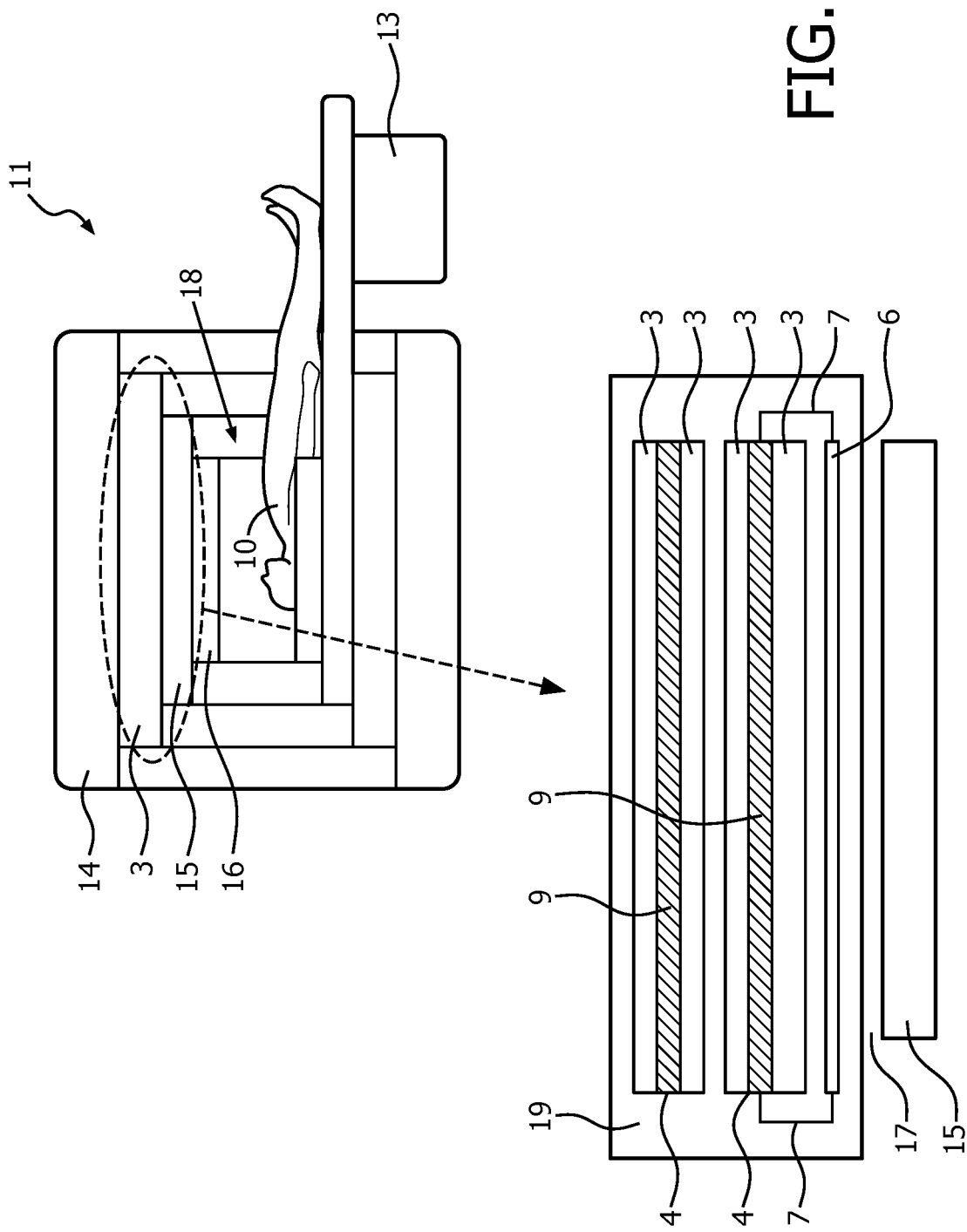
FIG. 1 is a schematic longitudinal sectional view of an MRI system according to an embodiment of the invention.

In FIG. 1 a schematic longitudinal sectional view of an MRI system 11 according to an embodiment of the invention is depicted. This MRI system 11 comprises an assembly 1 with a gradient coil 3, a cooling arrangement 2 for cooling the gradient coil 3, and an RF shield 6. The cooling arrangement 2 comprises cooling tubes 4 in which a cooling fluid 9 like water flows and which are in thermal contact with the gradient coils 3. The gradient coils 3 and the cooling arrangement 2 are embedded in a resin material 19.

This MRI system further comprises a magnet 14, an RF transmit coil 15, an RF receive coil 16 and a cooling gap 17 for allowing cooling air to reach the area between the RF transmit coil 15 and the RF shield 6. An examination object 10, e.g. a patient, can be positioned on an patient support 13. With this patient support 13 the examination object 10 can be disposed in an examination area 18 in the MRI system 11 which is surrounded by the magnet 14, the cooled gradient coil 3, the RF shield 6, the RF transmit coil 15 and the RF receive coil 16 for MRI examination.

According to this preferred embodiment of the invention two first thermal connectors 7 are disposed between the RF shield 6 and the at least one cooling tube 4 and in thermal contact with the RF shield 6 and the at least one cooling tube 4, thereby thermally connect the RF shield 6 with this cooling tube 4. The first thermal connectors 7 are radially disposed outside the gradient coil 3 at its two longitudinal ends thereby thermally connecting the RF shield 6 with one of the cooling tubes 4. Thus, the two first thermal connectors 7 do not go through the gradient coil 4. In this way, further cooling can be achieved in an efficient way.

Figure 2:
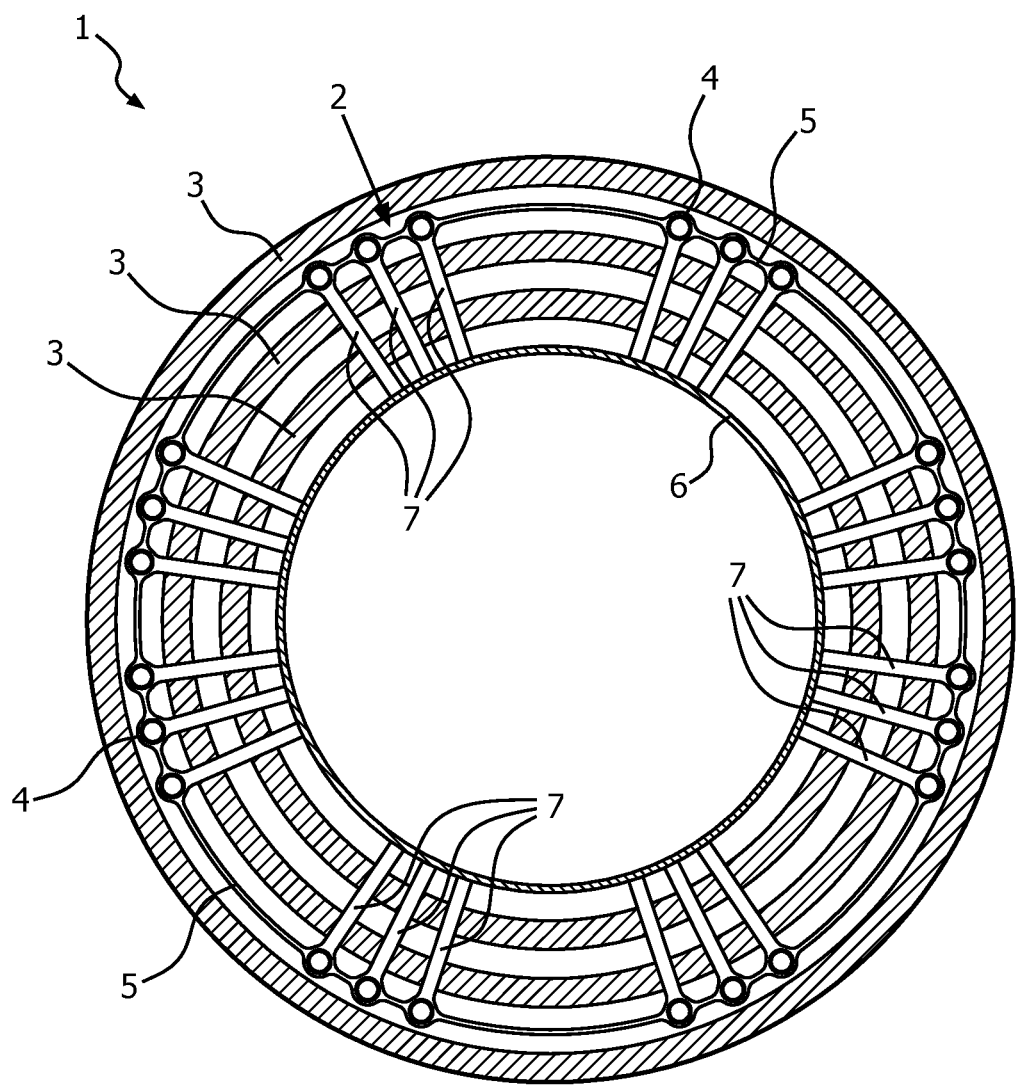
FIG. 2 is a schematic cross sectional front view of another assembly including a cooling system in accordance with an embodiment of the invention.

From FIG. 2, a schematic cross sectional front view of another assembly 1 in accordance with another embodiment of the invention can be seen. FIG. 2 shows a gradient coil 3 that comprises three coil winding layers which are embedded into a resin material 19 together with a cooling arrangement 2. This cooling arrangement 2 is comprised of second thermal connectors 5 which are fixed to different cooling tubes 4 thereby connecting the different cooling tubes 4 with each other in a thermally conducting manner. According to the invention it is also possible that second thermal connectors 5 are fixed to different windings of one cooling tube 4 connecting these different windings of the cooling tube 4 in a thermally conducting manner. It should be noted that both possibilities can also be combined in one single embodiment.

Further, in addition to the second thermal connectors 5, according to the preferred embodiment shown in FIG. 2, first thermal connectors 7 are provided which connect the cooling tubes 4 with the RF shield 6 in a thermally connecting manner. In this respect, the embodiment of FIG. 2 relates to the embodiment shown in FIG. 1. As already stated above, the first thermal connectors 7 do not go through the gradient coil 3. Instead, the first thermal connectors 7 are disposed at the longitudinal ends of the gradient coil 3 outside of the gradient coil 3.

FIGS. 3 to 7 show perspective views of cooling tubes with second thermal connectors 7 according to different preferred embodiments of the invention. As can be seen from FIG. 3, the second thermal connectors 5 between the different cooling tubes 4 have a planar extension in the plane for disposing the cooling tubes 4. While according to the arrangement of FIG. 3 the second thermal connectors 7 connect the different cooling tubes 4 in order to allow heat transfer between the cooling tubes 4, in the arrangement of FIG. 4 the second thermal connectors 5 between the different cooling tubes 4 comprises cut-outs 12 in a longitudinal direction of the second thermal connector 5 thereby forming a cooling fins. In this way, heat which is transferred from the cooling tubes 4 into the second thermal connectors 5 can be dissipated into the surroundings of the gradient coil 3.

Figure 3:
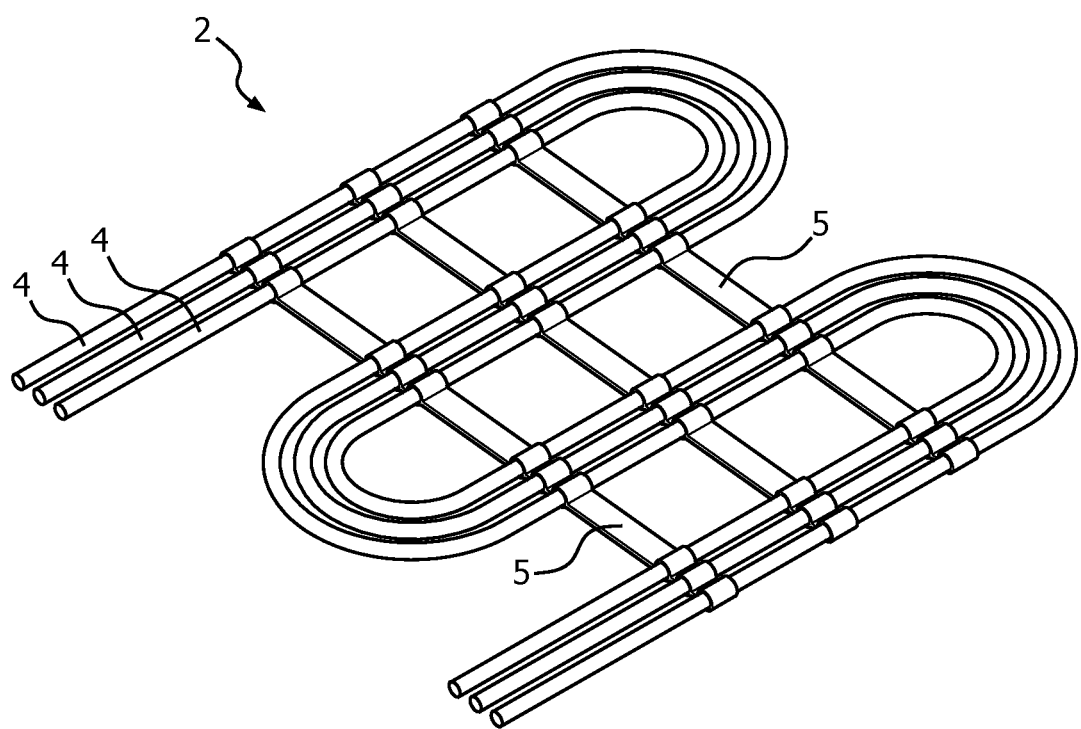
FIG. 3 is a schematic perspective view of cooling tubes with second thermal connectors according to another embodiment of the invention.
Figure 4:
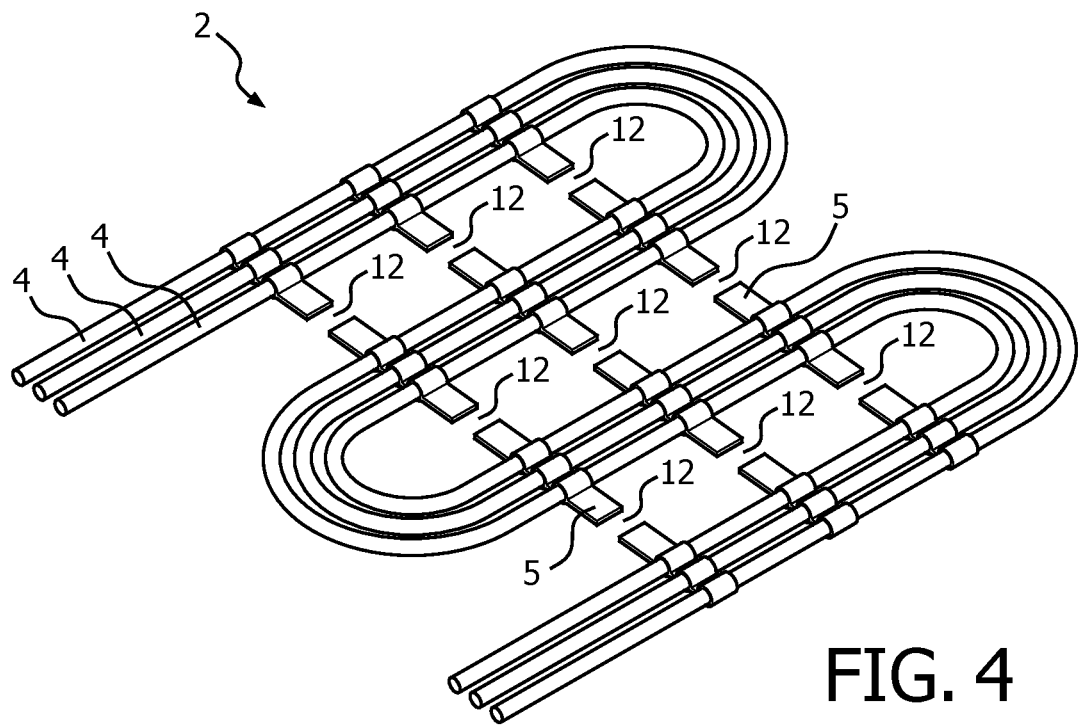
FIG. 4 is a schematic perspective view of cooling tubes with second thermal connectors according to another embodiment of the invention.
Figure 5:
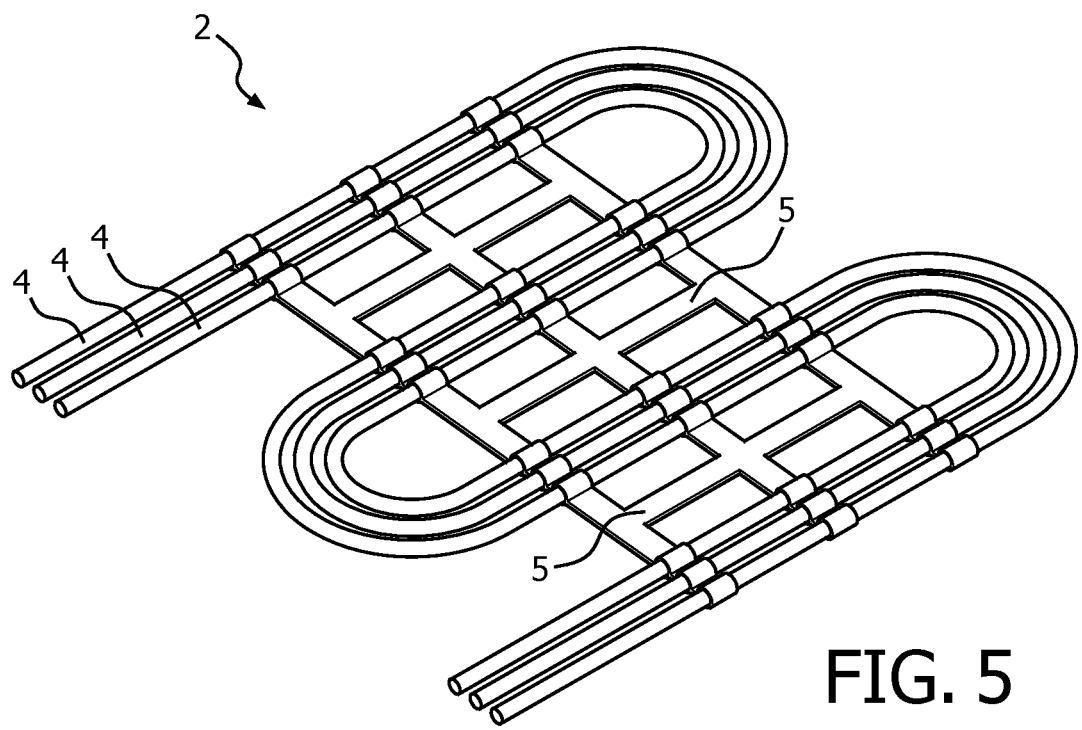
FIG. 5 is a schematic perspective view of cooling tubes with second thermal connectors according to another embodiment of the invention.
Figure 6:
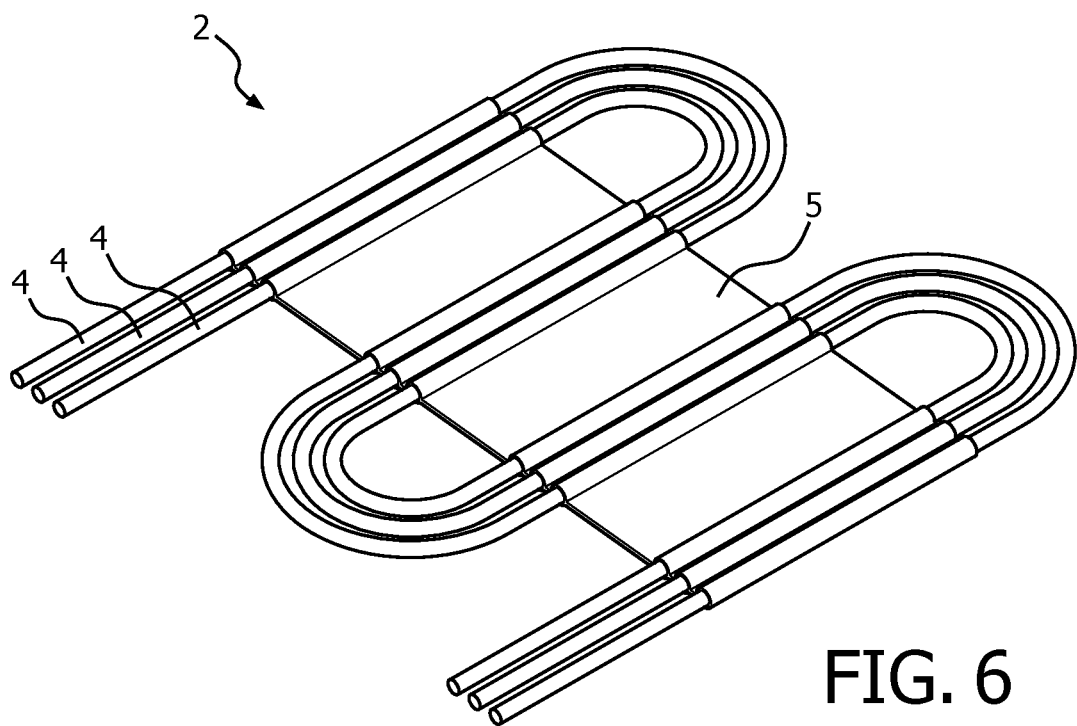
FIG. 6 is a schematic perspective view of cooling tubes with second thermal connectors according to another embodiment of the invention.

Further, the arrangement of FIG. 5 resembles the arrangement of FIG. 3 while the second thermal connectors 5 between the different cooling tubes 4 are connected with each other. This enhances efficient heat transfer and, thus, allows for a homogeneous temperature distribution. Instead of multiple second thermal connectors 5 which are connected with each other, according to the preferred embodiment of FIG. 6, a single second thermal connector 5 can be provided which covers a larger area and, thus, also allows for an efficient heat transfer, thereby providing effective cooling of the gradient coil 3.

Figure 7:
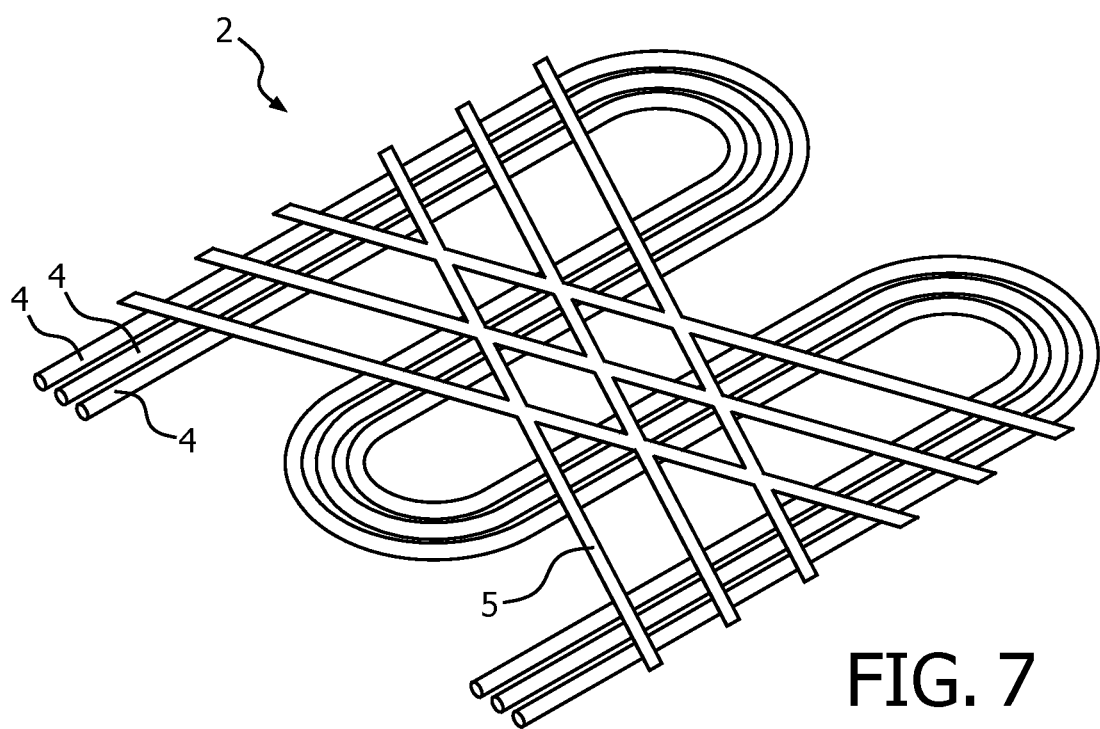
FIG. 7 is a schematic perspective view of cooling tubes with second thermal connectors according to another embodiment of the invention.

If a plurality of second thermal connectors 5 is provided at least a part of the thermal connectors 5 between different cooling tubes 4 may be disposed in a staggered arrangement. Such a preferred embodiment of the invention is shown in FIG. 7.

It is common to all preferred embodiments described before, that the first thermal connectors 7 and/or the second thermal connectors 5 are preferably bonded and/or welded onto the cooling tube 4. In this respect, the first thermal connectors 7 and/or the second thermal connectors 5 are preferably made from a flexible thermal conductor material. According to the embodiments shown in FIGS. 3-7 copper strap is used for the first thermal connectors 7 and the second thermal connectors 5, respectively. With such a copper strap for the first thermal connectors 7 and the second thermal connectors 5 a snug fit to the cooling tubes 4 can be achieved which further supports an efficient heat transfer from the cooling tubes 4 into the first thermal connectors 7 and the second thermal connectors 5, respectively. However, as already mentioned above, the invention is not restricted to metal as a material for the first thermal connectors 7 and the second thermal connectors 5. Alternatively, according to a preferred embodiment of the invention, the first thermal connectors 7 and/or the second thermal connectors 5 are made from any material whose thermal conductive is higher than Epoxy, e.g., a thermally conductive ceramic material.

Figure 8:
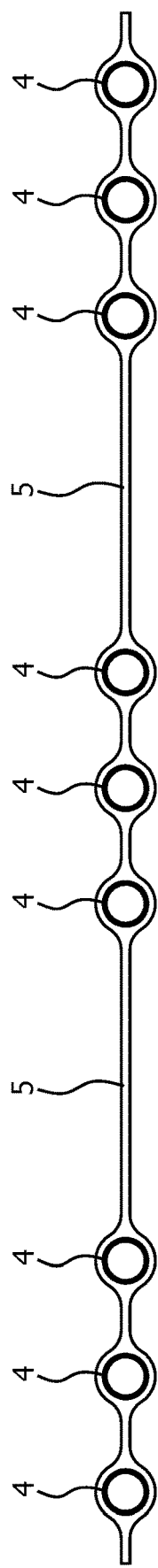
FIG. 8 is a schematic representation of cooling tubes which are looped with a second thermal connector according to another embodiment of the invention.

From FIG. 8 it can be gathered that according to another preferred embodiment of the invention cooling tubes 4 are looped with a second thermal connector 5. Therefore, according to this design, the part of the second thermal connector 5 which is fixed to the cooling tube 4 covers the cooling tube 4 circumferentially. This is preferably realized by using a flexible material for the second thermal connector 5. Further, this is not only a design option for the second thermal connector 5 but also for the first thermal connector 7.

Figure 9:
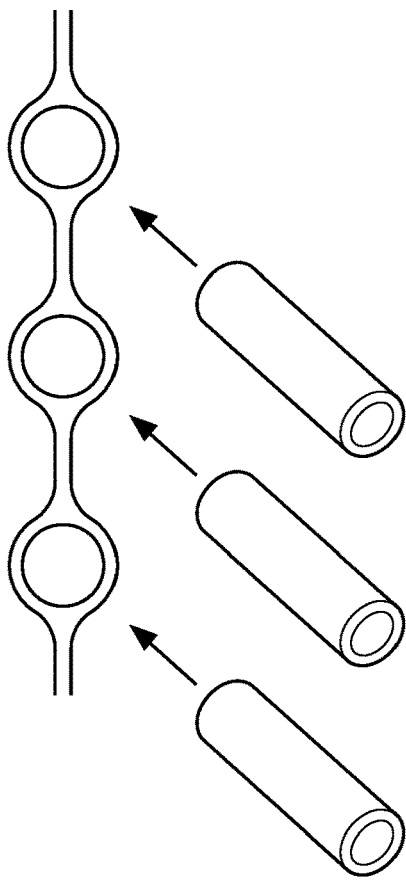
FIG. 9 is a schematic representation of an embodiment of the invention according to which second thermal connectors are welded onto metal rings.

FIG. 9 shows an embodiment of the invention according to which second thermal connectors 5 are welded onto metal rings 20. For fixing the second thermal connectors 5 to the cooling tubes 4 the metal rings 20 are welded or bonded to the cooling tubes 4. As for the design described with reference to FIG. 8, the present design can also be applied for the first thermal connectors 7.

Figure 10:
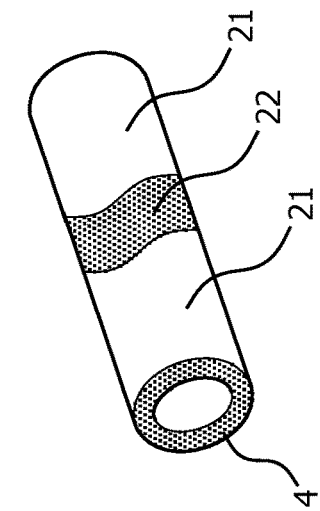
FIG. 10 is a schematic representation of a metal layer shielded cooling tube with an non-metallic insulation layer according to another embodiment of the invention.

Finally, FIG. 10 is a representation of a metal layer shielded cooling tube 4 with an non-metallic insulation layer 21. In order to be able to weld a first thermal connector 7 or a second thermal connector 5 onto the cooling tube 4, the insulation layer 21 is partly peeled off for providing a welding spot 22 for fixing the first thermal connector 7 or a second thermal connector 5, respectively. For this design option the first thermal connector 7 or a second thermal connector 5, respectively, is preferably made from a metallic flexible thermal conductor like a copper strap.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 1 assembly of a magnetic resonance imaging (MRI) system
2 cooling arrangement
3 gradient coil
4 cooling tube
5 second thermal connector
6 RF shield
7 first thermal connector
8 thermal connector arrangment
0 cooling fluid
10 examination object
11 MRI system
12 cut-out
13 patient support
14 magnet
15 RF transmit coil
16 RF receive coil
17 cooling gap
18 examination area
18 resin material
20 metal ring
21 insulation layer
22 welding spot

The invention claimed is:

1. A method for cooling a gradient coil of a magnetic resonance imaging system, comprising the following steps:
   providing a gradient coil assembly with a cooling arrangement for cooling the gradient coil, and an RF shield,
   providing the cooling arrangement with at least one cooling tube disposed on the gradient coil and configured to transport a cooling fluid,
   providing the cooling arrangement with a radially extending thermal connection between the RF shield and the at least one cooling tube.

2. The method of claim 1 further including: providing the cooling arrangement with a circumferential extending thermal connection between different windings of the at least one cooling tube and/or different tubes of the at least one cooling tube.

3. A gradient coil assembly of a magnetic resonance imaging system, the gradient coil assembly comprising:
   at least one gradient coil, a cooling arrangement for cooling the gradient coil, and an RF shield,
   wherein the cooling arrangement comprises at least one cooling tube disposed on the gradient coil and configured to transport a cooling fluid,
   wherein the assembly further comprises a thermal connector arrangement with a first thermal connector disposed between the RF shield and the at least one cooling tube, thereby providing a radially extending thermal connection from the at least one cooling tube to the RF shield.

4. The gradient coil assembly according to claim 3, wherein the first thermal connector is radially disposed in the assembly outside the gradient coil at its two longitudinal ends.

5. A magnetic resonance imaging system with a gradient coil assembly according to claim 3.

6. The gradient coil assembly of claim 3, further comprising:

a second thermal connector affixed to the at least one cooling tube, wherein the second thermal connector is configured to provide a circumferentially extending thermal connection between windings of a first one of the at least one cooling tube and/or between different cooling tubes of the at least one cooling tube.

7. A magnetic resonance imaging system with an gradient coil assembly according to claim 6.

8. The gradient coil assembly according to claim 6, wherein the second thermal connector comprises at least one cut-out in a longitudinal direction of the second thermal connector thereby forming a cooling fin.

9. The gradient coil assembly according to claim 6, wherein the second thermal connector comprises a plurality of first thermal parts disposed between windings of the first one of the at least one cooling tube and/or between different cooling tubes of the at least one cooling tube and a plurality of second thermal parts thermally connecting the first thermal parts to each other.

10. The gradient coil assembly according to claim 6, wherein the second thermal connector has a planar extension in the plane for disposing the at least one cooling tube.

11. The gradient coil assembly according to claim 6, wherein the second thermal connector comprises a plurality of thermal parts disposed between the at least one tube in a staggered arrangement.

12. The gradient coil assembly according to claim 6, wherein the first thermal connector and/or the second thermal connector are bonded and/or welded and/or glued onto the at least one cooling tube.

13. The gradient coil assembly according to claim 6, wherein the first thermal connector and/or the second thermal connector are welded on a ring wrapping around the at least one cooling tube.

14. The gradient coil assembly according to claim 6, wherein the first thermal connector and/or the second thermal connector are made from a material whose thermal conductive is higher than Epoxy.

15. The gradient coil assembly according to claim 6, wherein the first thermal connector and/or the second thermal connector are made from a flexible thermal conductor material.

16. The gradient coil assembly according to claim 6, wherein the first thermal connector and/or the second thermal connector comprise a copper strap.

17. The assembly according to claim 6, wherein the first thermal connectors and/or the second thermal connectors are made from a thermally conductive ceramic material.

\* \* \* \* \*